United States Patent [19]

Pohl

[11] 4,174,218

[45] Nov. 13, 1979

[54] RELIEF PLATES FROM POLYMER WITH TERMINAL UNSATURATION

[75] Inventor: Rudolph L. Pohl, Newark, Del.

[73] Assignee: Hercules Incorporated, Wilmington, Del.

[21] Appl. No.: 934,281

[22] Filed: Aug. 16, 1978

Related U.S. Application Data

[60] Division of Ser. No. 810334, Jun. 27, 1977, Pat. No. 4,137,081, which is a continuation-in-part of Ser. No. 628,862, Nov. 5, 1975, abandoned.

[51] Int. Cl.$^2$ .......................... G03C 5/00; G03C 1/78; G03C 1/96; G03C 1/68
[52] U.S. Cl. .................... 430/306; 204/159.15, 159.16 430/286; 430/309
[58] Field of Search .............. 96/35, 35.1, 36.3, 86 P, 96/115 R, 115 P, 87 R; 204/159.15, 159.16, 159.24

[56] References Cited

U.S. PATENT DOCUMENTS

| | | | |
|---|---|---|---|
| 3,467,523 | 9/1969 | Seidel et al. | 96/115 R |
| 3,628,963 | 12/1971 | Akamatsu et al. | 96/115 R |
| 3,787,212 | 1/1974 | Neimsch et al. | 96/35.1 |
| 3,809,633 | 5/1974 | Magnotta et al. | 204/159.14 |
| 3,861,917 | 1/1975 | Magnotta et al. | 96/86 P X |
| 3,907,574 | 9/1975 | Yonezawa et al. | 204/159.15 X |
| 3,929,489 | 12/1975 | Arcesi et al. | 204/159.15 X |

*Primary Examiner*—Edward C. Kimlin
*Attorney, Agent, or Firm*—Marion C. Staves

[57] ABSTRACT

It has been found that excellent quality photopolymer printing plates having hardness, flexibility, resilience, abrasion resistance and resistance to alcohol-based inks can be prepared from photopolymer compositions comprising a liquid polymer containing at least two terminal olefin groups attached to the polymer through a combination of at least two ether, thioether, ester, keto or amide groups, from about 1 to about 50% by weight based on the polymer of at least one ethylenically unsaturated monomer, from about 0.1 to about 10% by weight of a photoinitiator and about 0.01 to about 2% of a stabilizer.

3 Claims, No Drawings

RELIEF PLATES FROM POLYMER WITH TERMINAL UNSATURATION

This is a division of application Ser. No. 810,334, filed June 27, 1977, now U.S. Pat. No. 4,137,081, which is in turn a continuation-in-part of application Ser. No. 628,862, filed Nov. 5, 1975, now abandoned.

This invention relates to photopolymer compositions, processes for making printing reliefs and to photopolymer elements. More particularly, this invention relates to liquid, water dispersible photopolymer compositions which on exposure to actinic radiation will give cross-linked structures having hardness, flexibility, resilience, abrasion resistance and resistance to alcohol-based inks; photopolymer plates embodying a layer of such composition; and the process of making printing plate reliefs from such compositions.

Compositions capable of being converted under the influence of actinic light to solid, insoluble, tough structures are well-known and have become increasingly important in the preparation of printing plates. One of the fundamental patents relating to such compositions in U.S. Pat. No. 2,760,863 to Plambeck. In the process of the Plambeck patent, printing plates are produced directly by exposing to actinic light through an image-bearing process transparency a layer of an essentially transparent composition containing an addition polymerizable, ethylenically unsaturated monomer and an addition polymerization initiator activatable by actinic light. The layer of polymerizable composition is supported on a suitable support, and exposure of the composition is continued until substantial polymerization of the composition has occurred in the exposed areas with substantially no polymerization occurring in the nonexposed areas. The unchanged material in the latter areas then is removed, as by treatment with a suitable solvent in which the polymerized composition in the exposed areas is insoluble. This results in a raised relief image which corresponds to the transparent image of the transparency and which is suitable for use as a printing plate, as in letterpress and dry off-set work.

Photopolymerizable layers of the type of the Plambeck patent generally are prepared from polymeric components which are soluble in organic solvents. Accordingly, development of printing plates based on such compositions has required the use of organic solvents or of solutions containing high percentages of organic solvents. Due to the toxicity, high volatility and generally low flash point of low cost organic solvents, their use often gave rise to hazardous conditions. As a consequence, further research was directed and led to the development of several photopolymer layers which are soluble in water or aqueous alkali. For example, these layers have utilized polymeric components containing lateral acid groups, or the soluble salts thereof or certain water-soluble polymer compositions. In U.S. Pat. No. 3,794,494 water or aqueous alkali dispersible compositions are described suitable for use in rigid or elastic flexographic printing plate preparation. These compositions comprise combinations of unsaturated polyesters, polyunsaturated monomers and a photopolymerization initiator. However, flexible printing plates suitable for use in flexographic printing using alcohol-based inks cannot be prepared using compositions of the type described in the patent because the quick drying alcohol-based inks used in flexographic printing will cause the cured compositions to swell and disintegrate.

It has now been discovered that excellent quality photopolymer printing plates having hardness, flexibility, resilience, abrasion resistance and resistance to alcohol-based inks can be prepared from certain unique photopolymer compositions in accordance with this invention. The photopolymer composition of this invention comprises (1) a liquid polymer containing at least two terminal olefin groups attached to the polymer through a combination of at least two ether, thioether, ester, keto, or amide groups, (2) from about 1 to about 50% by weight based on the liquid polymer of at least one ethylenically unsaturated monomer selected from the group consisting of acrylonitrile, styrene, methyl substituted styrenes, N-vinyl pyrrolidone, and a monomer having its unsaturation in the form of at least one

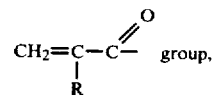

group, wherein R is hydrogen or a $C_1$–$C_3$ alkyl group, (3) from about 0.1 to about 10% by weight of a photoinitiator, and (4) about 0.01 to about 2% of a thermal polymerization inhibitor.

While the photopolymer compositions of this invention are not water-soluble, they are sufficiently water-dispersible so that unexposed portions of printing plates prepared from said compositions can be removed by washing with dilute aqueous solution of a detergent. Particularly useful detergents are anionic detergents such as olefin sulfonates.

The photopolymer compositions of this invention can readily be applied to a support, such as for example polyester film or a grained-metal sheet, from solution or by conventional coating procedures. Such layers will generally be from 3 to 250 mils in thickness. After exposure through a process transparency, the compositions are readily developable with an aqueous detergent solution to form printing reliefs, thus obviating the need for organic solvents, although organic solvents may be used either alone or in combination with water, if desired.

EXAMPLE 1

This example illustrates the use of a liquid polymer prepared from carboxyl terminated polybutadiene and glycidyl methacrylate, in a photopolymer composition in accordance with this invention.

Into a round bottom flask fitted with a stirrer, a reflux condenser, and an air sparge tube, is charged 3272 parts of a carboxyl terminated polybutadiene (sold by B. F. Goodrich Co. under the trademark "Hycar CTB"-2000X162) and 2.61 parts sodium methoxide catalyst. The mixture is heated with stirring while a stream of dry air is passed through. When the temperature reaches 100° C., 229 parts of glycidyl methacrylate are added, along with a mixture of thermal stabilizers comprising 0.26 part nitrobenzene, 0.49 part phenothiazine and 6.55 parts of di-tert-butyl-para-cresol. The reaction mixture is maintained at a temperature of 100° C. for 11 hours. The resulting terminally unsaturated polymer has an acid number of 2.8 and a Brookfield viscosity measured at 25° C. of 92,410 cps.

A portion of the above prepared polymer, comprising 3087 parts, is stirred together with a mixture of unsaturated monomers comprising 210.5 parts of 1,6-hexanediol dimethacrylate and 210.5 parts of lauryl methacrylate and 140.3 parts of 2,2-diethoxyacetophenone photoinitiator. This mixture is stirred at room temperature for one hour, at which time it is completely homogeneous. The resulting photopolymer composition has a Brookfield viscosity measured at 25° C. of 21,200 cps.

The above prepared photopolymer composition is then poured into a rubber frame 2 mm. thick. A glass plate is placed over the frame in contact with the composition. The composition is then exposed through the glass plate at room temperature for 60 seconds to a bank of 10 30-watt ultraviolet fluorescent lights (Westinghouse F30T8/BL) set at a distance of 7 cm. from the glass. The glass plate with the photopolymer composition attached is separated from the mold and immersed in a wash bath containing an aqueous solution of 1.0% α-olefin sulfonate detergent (sold by Stepan Chemical Corporation under the trademark "Bioterg"). The uncrosslinked liquid composition is dispersed in the aqueous solution. The portion of composition next to the glass (nearest the ultraviolet lights) is hardened. The thus hardened composition is peeled from the glass and dried. It is found to have a thickness of 0.014 inch.

EXAMPLE 2

This example illustrates the physical properties of the cross-linked photopolymer composition described in Example 1.

A sample of the photopolymer composition described in Example 1 is spread to a thickness of 0.04 inch on a glass plate using a doctor blade. The composition is covered with a 0.004 inch polyester film and exposed to ultraviolet lights as described in Example 1 for 20 seconds through the polyester film. The composition is then exposed through the glass plate to a 3 kilowatt medium pressure mercury arc lamp for 4.5 minutes. The polyester film is peeled off the cross-linked composition and the hardened composition in turn peeled off the glass. Dumbbell shaped samples are cut from the cross-linked composition and used to determine its physical properties. The cross-linked composition has a tensile strength of 240 psi, an elongation of 70%, a tensile modulus of 470 psi, a Bayshore resilience of 47%, and a Shore A hardness of 52.

EXAMPLE 3

This example illustrates the solvent resistant properties of the cross-linked photopolymer composition described in Example 1 in various solvents.

Samples of cross-linked photopolymer composition are prepared in a thickness of 50 mils as described in Example 2 and tested in various solvents. The percent weight gain and change in Shore A hardness are tabulated in Table I below:

TABLE I

SOLVENT RESISTANCE OF CROSS-LINKED PHOTOPOLYMER COMPOSITION

| Run | Solvent | % Weight Gain (x) | Change in Shore A Hardness |
|---|---|---|---|
| a | Water | 0 | +2 |
| b | Methanol | 2 | 0 |
| c | Ethanol | 2 | 0 |
| d | N-propanol | 4 | −2 |
| e | Isopropanol | 3 | −2 |
| f | Ethylene glycol | −1 | +1 |
| g | Propylene glycol | −1 | +1 |
| h | Diethylene glycol | −1 | 0 |
| i | Cellosolve | 10 | −7 |

TABLE I-continued

SOLVENT RESISTANCE OF CROSS-LINKED PHOTOPOLYMER COMPOSITION

| Run | Solvent | % Weight Gain (x) | Change in Shore A Hardness |
|---|---|---|---|
| j | Butyl cellosolve | 13 | −1.4 |
| k | Acetone | 20 | −3 |
| l | Methyl Ethyl Ketone | 50 | −4 |
| m | Ethyl acetate | 62 | −4 |
| n | Heptane | 75 | -disintegrated |
| o | Kerosene | 82 | −4 |
| p | Xylene | — | -disintegrated |
| q | Perchloroethylene | — | -disintegrated |
| r | 90% Denatured ethyl alcohol 10% Ethyl acetate | 5 | −2 |
| s | 80% Denatured ethyl alcohol 20% Ethyl acetate | 9 | −5 |
| t | 77% Water 17% Isopropanol 6% NH4OH-Conc. | 1.5 | 1.5 |

(x)After 24 hours immersion in solvent at room temperature, samples 50 mils thick, polyester substrate sheet attached.

EXAMPLE 4

This example illustrates the use of a liquid polymer prepared from carboxyl terminated butadiene-acrylonitrile copolymer and glycidyl methacrylate, in a photopolymer composition in accordance with this invention.

Into a flask equipped as described in Example 1 is charged 536 parts of a carboxyl terminated butadiene-acrylonitrile copolymer, having an acid number of 31.1 and containing 17% acrylonitrile, 98.0 parts of glycidyl methacrylate, 0.43 parts of sodium methoxide catalyst and 2.41 parts of di-tert-butyl-para-cresol stabilizer. The reaction mixture is stirred and heated at a temperature of 100° C. for 5 hours. The resulting terminally unsaturated polymer has an acid number of 0.8.

A portion of the above prepared polymer, comprising 440 parts is stirred together with a mixture of unsaturated monomers comprising 30 parts of 1,6-hexanediol dimethacrylate and 30 parts of lauryl methacrylate and 20 parts of 2,2-diethoxyacetophenone photoinitiator until it is completely homogeneous. A sample of the resulting photopolymer composition is stored in the dark for 50 days at a temperature of 60° C. After storage the composition is examined and found not to have gelled.

A sample of the above prepared photopolymer composition is poured into a rubber frame and a glass plate placed over the frame in contact with the composition. The composition is then exposed through the glass plate to ultraviolet light exactly as described in Example 1. A 0.017 inch layer of cross-linked (i.e. hardened) composition is formed next to the glass plate.

Specimens of the cross-linked photopolymer composition 50 mils thick are prepared and tested to determine physical properties exactly as described in Example 2. The cross-linked composition is found to have a tensile strength of 360 psi, an elongation of 70%, a tensile modulus of 736 psi, a Bayshore resilience of 37% and a Shore A hardness of 59. Specimens soaked in ethyl alcohol for 24 hours at room temperature gain 6% in weight. Specimens soaked in isopropanol under the same conditions gain 8% in weight.

EXAMPLE 5

This example illustrates the use of a liquid polymer prepared from amine terminated butadiene-acrylonitrile copolymer and glycidyl methacrylate, in a photopolymer composition in accordance with this invention.

Into a flask equipped as described in Example 1 is charged 934.8 parts of an amine terminated butadiene-acrylonitrile copolymer (sold by B. F. Goodrich Co. under the trademark "Hycar ATBN"), 374 parts of glycidyl methacrylate and a mixture of thermal stabilizers comprising 0.07 part of nitrobenzene, 0.14 part of phenothiazine and 1.87 parts of di-tert-butyl-paracresol. The reaction mixture is stirred and heated at a temperature of 60° C. for 4 hours.

A portion of the resulting terminally unsaturated polymer, comprising 246 parts is stirred together with a mixture of unsaturated monomers comprising 18 parts of 1,6-hexanediol dimethacrylate and 18 parts of lauryl methacrylate, 12 parts of 2,2-diethoxyacetophenone photoinitiator and 1.2 parts of di-tert-butyl-para-cresol stabilizer, for one hour at room temperature.

A 40 mil layer of the resulting photopolymer composition is cross-linked by exposure to a 3 kilowatt medium pressure mercury arc lamp for 3.5 minutes. Samples of the cross-linked composition are tested for physical properties and found to have a tensile strength of 2100 psi, an elongation of 32%, a tensile modulus of 23,200 psi, and a Shore A hardness of 88.

EXAMPLE 6

This example illustrates the use of the photopolymer composition described in Example 1 in the preparation of a printing plate.

A portion of the photopolymer composition described in Example 1 is spread in a 0.067 inch thick layer on a 4 mil polyester backing sheet (support) and exposed through an image bearing negative transparency to a 3 kilowatt medium pressure mercury arc lamp for 6 minutes. The uncrosslinked photopolymer composition is washed away using an aqueous solution of 1.0% α-olefin sulfonate (Bioterg®) at 50° C. The resulting printing plate is dried, and post-cured by exposing under a nitrogen atmosphere to a bank of 10 30-watt ultraviolet fluorescent lights for 12 minutes. The resulting printing plate is completely tack-free.

The thus prepared printing plate is mounted on a flexographic printing press and the press run at a speed of 250–300 fpm. until approximately 10,000 impressions are made. The ink used during the press run is a red flexographic ink containing as solvents 3% methyl alcohol, 73% ethyl alcohol, 10% isopropyl alcohol, 10% ethyl cellosolve and 4% water. On completion of the press run the plate is visually examined and shows no sign of wear, swelling or tack. The printed impressions are of high quality.

EXAMPLE 7

This example illustrates the use of the terminally unsaturated polymer described in Example 1 in various photopolymer compositions.

In each case the terminally unsaturated polymer containing the mixture of thermal stabilizers as described in Example 1 is stirrer with one or more unsaturated monomers and a photoinitiator to form a photopolymer composition. Samples for the testing of physical properties are spread to a thickness of 50 mils on a glass plate and covered with an 0.004 inch polyester film. Each sample is then exposed to ultraviolet light through the polyester film as described in Example 1 for one minute and then through the glass plate to a 3 kilowatt medium pressure mercury arc lamp for 4 minutes. Additional samples are prepared the same way except they are only exposed to the ultraviolet light through the polyester film for periods of time ranging from 30 to 180 seconds. The components of the photopolymer compositions, the thickness of the cross-linked layers formed on exposure for 30 to 180 seconds and the physical properties of the samples completely cross-linked are recited below in Table II.

TABLE II

| Components of Photpolymer Composition | Parts per Hundred | | | | | | | | | |
|---|---|---|---|---|---|---|---|---|---|---|
| Terminally unsaturated polymer | 88 | 88 | 88 | 88 | 88 | 88 | 88 | 88 | 88 | 77 |
| Lauryl Methacrylate | 6 | 4.2 | 7.8 | 6 | 6 | 6 | 6 | 6 | 12 | — |
| 1,6-Hexanediol dimethacrylate | 6 | 7.8 | 4.2 | 6 | 6 | — | — | — | — | 23 |
| Tetraethylene glycol dimethacrylate | — | — | — | — | — | 6 | — | — | — | — |
| Polypropylene glycol dimethacrylate | — | — | — | — | — | 13 | 6 | — | — | — |
| 1,3-Butylene glycol dimethacrylate | — | — | — | — | — | — | — | 6 | — | — |
| 2,2-Diethoxyacetophenone (photoinitiator) | 4 | 4 | 4 | 6 | — | 4 | 4 | 4 | 4 | — |
| Benzoin isobutyl ether (photoinitiator) | — | — | — | — | 1.0 | — | — | — | — | 1.8 |
| Thickness in mm | | | | | | | | | | |
| Thickness in mm of cross-linked layer after exposure for the following period of time: | | | | | | | | | | |
| 30 sec. | — | — | — | — | 0.10 | 0.12 | — | — | — | 0.35 |
| 60 sec. | 0.21 | 0.25 | 0.23 | 0.26 | 0.29 | 0.36 | 0.32 | 0.24 | 0.19 | 0.68 |
| 90 sec. | 0.39 | 0.40 | 0.41 | 0.41 | 0.52 | 0.48 | 0.48 | 0.37 | 0.31 | 0.83 |
| 120 sec. | 0.50 | 0.51 | 0.52 | 0.55 | 0.63 | 0.58 | 0.60 | 0.50 | 0.39 | 1.12 |
| 180 sec. | 0.69 | 0.70 | 0.71 | 0.75 | 0.89 | 0.74 | 0.76 | 0.68 | 0.56 | 1.25 |
| Physical Properties | | | | | | | | | | |
| Tensile Strength - psi[a] | 220 | 230 | 200 | 230 | 220 | 180 | 170 | 270 | 150 | — |
| Elongation - % | 70 | 60 | 80 | 70 | 80 | 80 | 80 | 80 | 100 | — |
| Tensile Modulus - psi | 400 | 470 | 331 | 370 | 373 | 206 | 290 | 430 | 360 | — |
| Shore A Hardness | 47 | 52 | 42 | 42 | 46 | 42 | 40 | 48 | 44 | 83 |
| Resilience - %[b] | 46 | 47 | 44 | 44 | 44 | 44 | 44 | 44 | 50 | — |
| % Weight gain in ETOH[c] | 2 | 2 | 2 | 2 | 2 | 4 | 4 | 2 | 2 | 3 |

[a]Tensile properties are measured with an Instron tester using 2 inches/min. crosshead speed.
[b]Resilience measured on a stack of 5 samples, each 50 mils thick, % return after steel ball dropped from 30 cm.
[c]Samples soaked in ethyl alcohol for 24 hours at a temperature of 25° C.

EXAMPLE 8

This example illustrates the use of a vinyl terminated butadiene-acrylonitrile copolymer in a photopolymer composition in accordance with this invention.

A portion, comprising 77 parts, of a vinyl terminated butadiene-acrylonitrile copolymer (sold by B. F. Goodrich Co. under the trademark "Hycar VTBN" - 1300X14, containing 17% acrylonitrile and having a number average molecular weight of approximately 3400) is stirred together with 23 parts of tetraethylene glycol dimethacrylate (unsaturated monomer), 1.8 parts of benzoin isobutyl ether (photoinitiator) and 0.1 part of di-tert-butyl-para-cresol (stabilizer) until the composition is completely homogeneous (about one hour).

The above prepared photopolymer composition is poured into a rubber frame, covered with a glass plate and exposed to a bank of ultraviolet lights as described in Example 1. A layer 0.043 inch thick of cross-linked composition is formed. A sample of the cross-linked composition swelled 7% after soaking for 24 hours at room temperature in ethyl alcohol.

EXAMPLE 9

This example illustrates the use of a mixture of ethylenically unsaturated monomers containing N-vinyl-2-pyrrolidone in accordance with this invention.

A portion, comprising 520 parts of the terminally unsaturated polymer, prepared by reacting carboxyl terminated polybutadiene with glycidyl methacrylate as described in Example 1, is blended with a mixture of ethylenically unsaturated monomers comprising 144 parts of lauryl methacrylate, 60 parts of 1,3-butylene glycol dimethacrylate and 76 parts of N-vinyl-2-pyrrolidone and 4.8 parts of 2,2-dimethoxy-2-phenylacetophenone photoinitiator at room temperature until the mixture is completely homogeneous. The resulting photopolymer composition has a Brookfield viscosity measured at 25° C. of 4100 cps.

A sample of the photopolymer composition is spread to a thickness of 0.04 inch on a glass plate using a doctor blade, covered with a polyester film, exposed from both sides and tested to determine its physical properties, all as described in Example 2. The hardened resin has a tensile strength of 780 psi, an elongation of 83%, a tensile modulus of 813 psi, and a Shore A hardness of 64.

EXAMPLE 10

This example illustrates the use of an inert particulate filler in a photopolymer composition in accordance with this invention.

A portion, comprising 180 parts of the terminally unsaturated polymer described in Example 1, is blended with a mixture of ethylenically unsaturated monomers comprising 69 parts of lauryl methacrylate, 15 parts of 1,3-butylene glycol dimethacrylate and 36 parts of N-vinyl-2-pyrrolidone, 1.8 parts of 2,2-dimethoxy-2-phenylacetophenone photoinitiator and 13.1 parts of fumed silica particulate filler at room temperature until the mixture is completely homogeneous. The resulting photopolymer composition has a Brookfield viscosity measured at 25° C. of 6130 cps.

A 0.04 inch thick sample of the photopolymer composition is cured and tested to determine its physical properties, all as described in Example 2. The cured resin has a tensile strength of 630 psi, an elongation of 90%, a tensile modulus of 595 psi, and a Shore A hardness of 60.

As stated above, the terminally unsaturated polymers used in the photopolymer compositions of this invention are liquid polymers containing at least two terminal olefin groups attached to the polymer through a combination of at least two ether, thioether, ester, keto or amide groups. These terminal olefinically unsaturated polymers will have one of the following structures

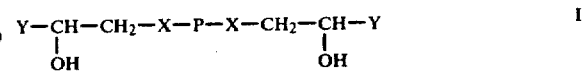

I

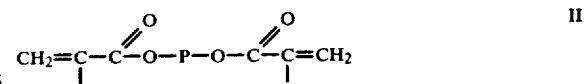

II

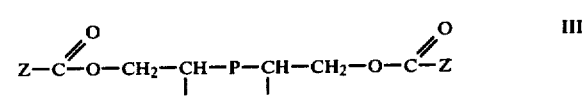

III

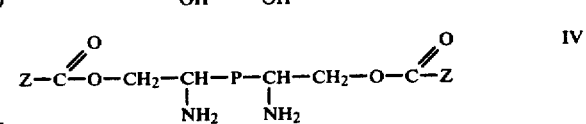

IV

V where X is selected from —O—, —S—,

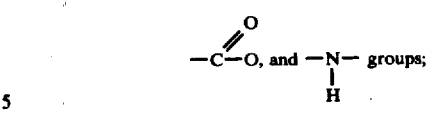

Y is selected from —O—CH$_2$—CH=CH$_2$ and

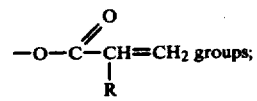

R' is selected from —H and —CH$_3$ groups; Z is selected from

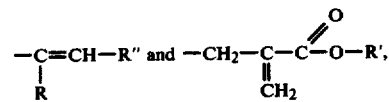

where R" is selected from —H, —CH$_3$ and

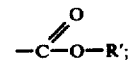

and P is a polymer residue selected from liquid homopolymers of butadiene, isoprene, chloroprene, styrene, isobutylene, ethylene and copolymers of butadiene with acrylonitrile, butadiene with styrene, butadiene with isoprene, ethylene with neohexene, isobutylene with styrene, and isobutylene with acrylonitrile and the corresponding saturated polymer residues. Preferably the above liquid polymers will have a molecular weight in the range of 1000 to 20,000, most preferably in the range of 3000 to 6000. It will be understood by those skilled in the art that if the polymer residue above was prepared by free radical polymerization, it may retain connecting groups originating from the free radical initiator employed in its preparation.

A typical liquid polymer employed in the photopolymer composition of this invention is one prepared by reacting a butadiene, isoprene, chloroprene, styrene, isobutylene, or ethylene polymer or a butadiene-acrylonitrile, butadiene-isoprene, butadiene-styrene, or ethylene-neohexene copolymer containing carboxyl, amine, hydroxyl, thiol, oxirane, or aziridine terminal groups, or corresponding products from which the olefinic unsaturation has been removed as by hydrogenation, with a glycidyl allyl ether, acrylate and copolymers of the type useful for preparing these terminally unsaturated polymers are prepared by a free radical polymerization using special catalysts or by anionic polymerization followed by capping the living polymer by carbon dioxide, ethylene oxide, etc. as described in an article by French in Rubber Chemistry and Technology, Vol. 42, pages 71-107 (1969). The step of adding the terminal unsaturated group to the functionally terminated polymer (i.e. the second step in preparing the terminally unsaturated polymer) is not a polymerization.

More particularly, the polymers of structure I can be prepared by reaction of functionally terminated or telechelic polymers of the type described by French in the Rubber Chemistry and Technology article referred to above, in which the terminal functional groups are carboxyl, hydroxyl, thiol or amine groups, with compounds such as allyl glycidyl ether, glycidyl acrylate, glycidyl methacrylate, glycidyl crotonate, ethyl itaconate monoglycidyl ester or methyl fumarate monoglycidyl ester.

Polymers of structure II can be prepared by reaction of telechelic polymers containing hydroxyl functional groups with acrylic or methacrylic acid or the corresponding anhydride.

Polymers of structures III and IV can be prepared by reaction of telechelic polymers containing oxirane and aziridine functional groups, respectively, with unsaturated polymerizable acids such as acrylic, methacrylic, or the monoalkyl esters of crotonic, itaconic, or fumaric acid.

Polymers of the structure V are vinyl ketone terminated telechelic polymers.

In general the terminal olefinically unsaturated polymers employed in the photopolymer composition of this invention are viscous liquids, having Brookfield viscosities, measured at 25° C., of between 1,000 and 1,000,000 centipoises, most preferably between 20,000 and 100,000 centipoises.

As an illustration of the type of reaction involved to introduce the terminal unsaturation into the low molecular weight polymers and copolymers to prepare the polymers useful for this invention, the reaction between a carboxyl terminated polybutadiene and glycidyl acrylate

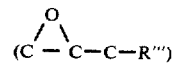

is represented below.

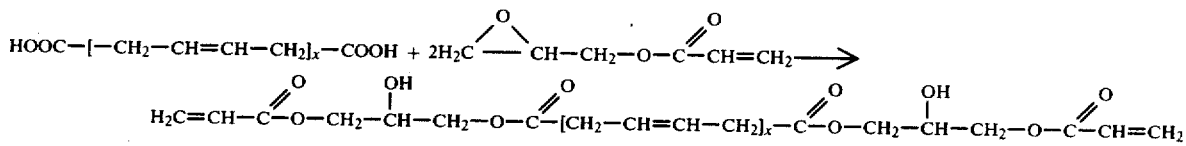

As indicated two moles of epoxy compound react with each mole of olefin addition polymer. Generally, however, a slight excess of epoxide is used.

It is also possible to use a large excess of epoxy compound. In this case, chain extension occurs. The excess epoxide reacts with the hydroxyl groups formed by the initial reaction between the functionally terminated olefin addition polymer and the epoxy compound. For example:

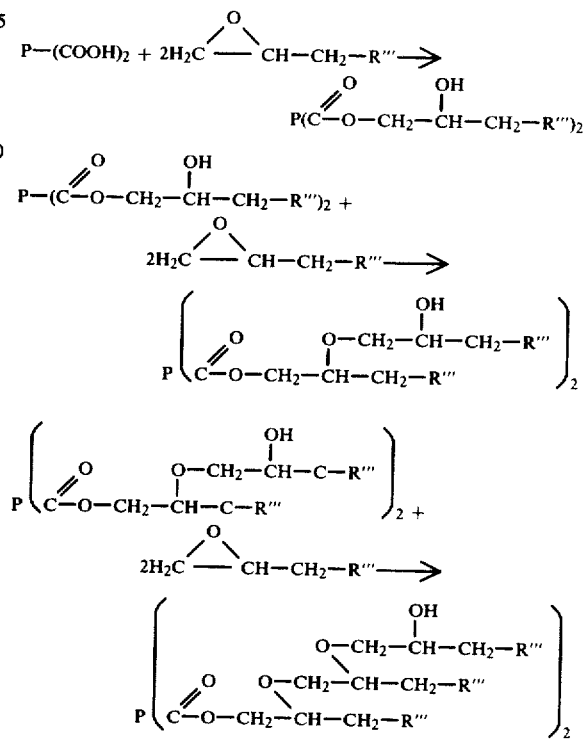

These reactions can be run between 25° and 200° C. with a temperature range of 100°-125° being preferred. An acid or basic catalyst can be used to reduce the required reaction temperature and time. Some useful catalysts are sodium hydroxide, sodium ethoxide, triethylamine, triethylbenzyl ammonium chloride, hydrogen chloride, and boron trifluoride etherate. Generally, 0.001 to 5.0% by weight catalyst is used.

To make the polymer with only single terminal double bonds, close to a stoichiometric amount of epoxide and a basic catalyst should be used. To make a chain extended polymer, a large excess of epoxide and an acidic catalyst is preferred.

The ethylenically unsaturated monomer components of the compositions of this invention are selected from acrylonitrile, methacrylonitrile, styrene, methyl substituted styrenes, N-vinyl pyrrolidone, and compounds containing one or more

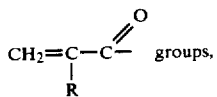 groups, wherein R is hydrogen or a $C_1$-$C_3$ alkyl group.

Useful monofunctional ethylenically unsaturated monomers include acrylonitrile, methacrylonitrile, styrene, 2-methylstyrene, α, p-dimethylstyrene, N-vinyl pyrrolidone, acrylic acid, methacrylic acid, esters of acrylic acid and methacrylic acid containing up to 22 carbon atoms, acrylamide, mono- and di-N-alkyl substituted acrylamides and methacrylamides containing up to 10 carbons in the alkyl group, and diacetone acrylamide.

A useful trifunctional monomer is 1,3,5-triacryloyl-hexahydro-1,3,5-triazine. This compound and related compounds such as the corresponding methacryloyl derivative have the structural formula

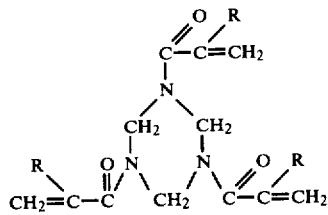 I wherein R is hydrogen or a $C_1$-$C_3$ alkyl group.

Other suitable difunctional monomers may be defined by the structural formula

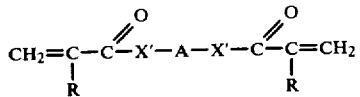 II wherein R again is hydrogen or a $C_1$-$C_3$ alkyl group; both X's are either —NH— or —O— and A is alkylene, substituted alkylene or alkylene oxy alkylene, A preferred monomer having this formula is N,N'-oxydimethylene-bis(acrylamide).

When X' in formula II above is —NH—, but A is alkylene or substituted alkylene, this is descriptive of another preferred monomer, N,N'-methylene-bis(acrylamide). This compound is one member of a valuable group of monomers represented by compounds having the formula

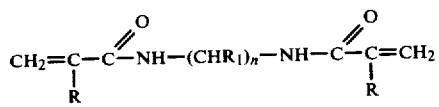 III wherein R is hydrogen or a $C_1$-$C_3$ alkyl group, $R_1$ is hydrogen, a $C_1$-$C_3$ alkyl group or phenyl, n is 1 to 6 and the total number of carbon atoms in —$(CHR_1)_n$— is no more than 10.

Representative of compounds of formula III above are N,N'-methylene-bis(acrylamide), N,N'-methylene-bis(methacrylamide), N,N'-methylene-bis(2-ethylacrylamide), N,N'-methylene-bis(2-propylacrylamide), N,N'-ethylene-bis(acrylamide), N,N'-ethylene-bis(methacrylamide), N,N'-(1,6-hexamethylene)-bis(acrylamide), N,N'-(1,6-hexamethylene)-bis(methacrylamide), N,N'-ethylidene-bis(acrylamide), N,N'-ethylidene-bis(methacrylamide), N,N'-benzylidene-bis(acrylamide), N,N'-butylidene-bis(methacrylamide) and N,N'-propylidene-bis(acrylamide). These compounds may be prepared by conventional reaction well known in the art, as for example, in U.S. Pat. No. 2,475,846.

Also useful monomers are those wherein X' in formula II above is —O—. When A is alkylene or substituted alkylene, the compounds are di-, tri-and tetra-acrylates of certain polyhydric alcohols. These acrylates may be illustrated by the general formula

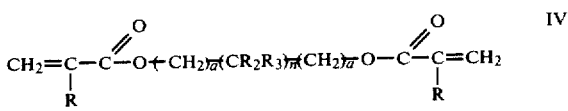 IV wherein R is hydrogen or a $C_1$-$C_3$ alkyl group, a is 0 or 1, $R_2$ is hydrogen, a $C_1$-$C_3$ alkyl group,

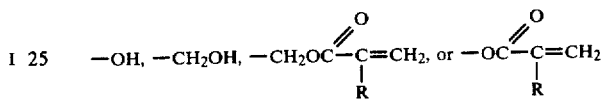

$R_3$ is hydrogen, a $C_1$-$C_3$ alkyl group, —$CH_2OH$ or

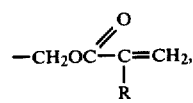

n is 1 to 6 and the total number of carbon atoms in —$(CR_2R_3)_n$— is no more than 11. Representative of these compounds are ethylene glycol diacrylate, ethylene glycol dimethacrylate, ethylene glycol di(2-ethylacrylate), ethylene glycol di(2-propylacrylate), 1,3-propylene glycol diacrylate, 1,4-butylene glycol diacrylate, 1,5-pentanediol dimethacrylate, glycerol diacrylate, glycerol triacrylate, trimethylolpropane triacrylate, trimethylolpropane trimethacrylate, pentaerythritol diacrylate, pentaerythritol triacrylate, pentaerythritol tetramethacrylate and pentaerythritol tetraaacrylate.

Closely related to the preceding acrylates are those which are derived from di-, tri- and tetra-ethylene glycol and di- and tri-propylene glycol. These compounds are those of formula II wherein X' is —O— and A is alkylene oxy alkylene, and they may be more specifically illustrated by the formula

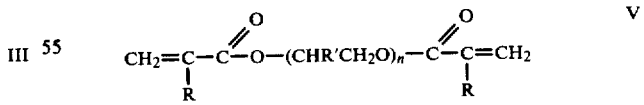 V wherein R is hydrogen or a $C_1$-$C_3$ alkyl group, R' is hydrogen or methyl, n is 2 to 4 when R' is hydrogen and is 2 to 3 when R' is methyl. Representative of these compounds are diethylene glycol diacrylate, diethylene glycol dimethacrylate, triethylene glycol diacrylate, triethylene glycol dimethacrylate, tetraethylene glycol diacrylate, tetraethylene glycol dimethacrylate, dipropylene glycol diacrylate, dipropylene glycol dimethacrylate, triporpylene glycol diacrylate and tripropylene glycol dimethacrylate.

While a single unsaturated monomer may be employed alone in the photopolymer composition, mixtures of two or more monomers are generally employed together to obtain best results. In any event the amount of monomer or monomers used to effect crosslinking of the polymer component of the compositions of this invention will be from about 1 to about 50%, most preferably from about 5 to about 25%.

The photoinitiators useful in the photopolymer compositions of this invention are generally well known and some are characterized by being photoreducible. They are compounds which absorb actinic light very strongly and thus becomes activated to the point where they will abstract hydrogen atoms from compounds which are hydrogen donors. By so doing, the photoinitiator is itself reduced and the hydrogen donor is converted into a free radical. Representative compounds are benzophenone, 2-chlorobenzophenone, 4-methoxybenzophenone, 4-methylbenzophenone, 4,4'-dimethylbenzophenone, 4-bromobenzophenone, 2,2',4,4'-tetrachlorobenzophenone, 2-chloro-4'-methylbenzophenone, 4-chloro-4'-methylbenzophenone, 3-methylbenzophenone, 4-tert-butylbenzophenone, benzoin, benzoin methyl ether, benzoin ethyl ether, benzoin isopropyl ether, benzoin isobutyl ether, benzoin acetate, benzil, benzilic acid, methylene blue, acetophenone, 2,2-diethoxyacetophenone, 9,10-phenanthrenequinone, 2-methyl anthraquinone, 2-ethyl anthraquinone, 2-tert-butyl-anthraquinone, and 1,4-naphthoquinone. Particularly suitable are 2,2-diethoxyacetophenone, benzoin isopropyl ether, benzoin isobutyl ether, and 2-ethyl anthraquinone. Also applicable are combinations of carboxyl sensitizer compounds and certain organic amine activators as disclosed in U.S. Pat. No. 3,759,807. In general, the photoinitiator should be thermally stable at temperatures up to about 100° C. Stability at such temperatures prevents premature crosslinking when the compositions of this invention are prepared or during storage. Such stability also minimizes, during exposure, any crosslinking in the unexposed areas caused by the heat generated in the crosslinking reaction and by the heat transmitted through the opaque sections of the transparency. The amount of photoinitiator will be from about 0.1 to about 10%, most preferably from about 1.0 to about 10% by weight based on the weight of the polymer in the photopolymer composition.

For the purpose of inhibiting premature crosslinking during thermal processing and storage of the photopolymer compositions of this invention, the incorporation of a thermal polymerization inhibitor and inhibitors is desirable. Such stabilizers also are well-known in the art, and they are exemplified by di-t-butyl-p-cresol, hydroquinone monomethylether, pyrogallol, quinone, hydroquinone, methylene blue, t-butyl catechol, hydroquinone monobenzyl ether, methyl hydroquinone, amyl quinone, amyloxy hydroquinone, n-butyl phenol, phenol, hydroquinone monopropyl ether, phenothiazine and nitrobenzene, used separately or in combination. When used in an amount within the range of from about 0.01 to about 2% by weight of the polymer, these stabilizers are quite effective in preventing crosslinking of the photopolymer composition during processing and storage. During exposure such amounts of stabilizer also delay and thus prevent crosslinking due to scattered light in the nonexposed areas of the composition, but do not greatly interfere with or delay the crosslinking of the composition in strongly exposed areas, thus aiding in formation of a plate of optimum depth and surface configuration.

The photopolymer compositions also may contain up to about 55% by weight of an inert particulate filler which is essentially transparent to actinic light. Representative of such fillers are the organophilic silicas, the bentonites, silica and powdered glass, all having a particle size less than 0.4 mil in their maximum dimension. Particles of 0.1 micron or less in size are preferred. Such fillers can impart desirable properties to the compositions and reliefs of this invention. Furthermore, the light scattering effected by the particulate fillers broadens the image toward the base of the plate so that the half-tone dots take on the appearance of truncated cones in cross-section. Such dots are stronger and have less tendency to break off than dots which are more cylindrical in cross-section.

When the photopolymer compositions of this invention are exposed to actinic light at a wave length of from about 3000 to about 4000 Å through a photographic negative or positive, the polymer beneath the exposed areas becomes insolubilized, whereas the polymer beneath the unexposed areas remains water dispersible. Subsequent washing of the plate removes the dispersible polymer, leaving a replica of the negative or positive in relief. Washing will normally be carried out with dilute aqueous solution of an aionic or nonionic detergent. Anionic detergents such as α-olefin sulfonates, alkylaryl sulfonates, lauryl sulfate, alkyl esters of sulfosuccinic acid, or sulfated ethylene oxide condensates of alkyl phenols or fatty alcohols, and nonionic detergents such as alkyl phenol, fatty alcohol or fatty acid ethylene oxide condensates may be used. α-olefin sulfonates are particularly useful. Detergent concentrations of about 0.2 to 2% will normally be employed, generally at temperatures of 25°–60° C. Development may frequently be accelerated by brushing or scrubbing. In large scale work, application of the water solvent will advantageously be carried out by means of jets or sprays. In some instances, it may be helpful to use minor quantities of organic solvents such as the short chain aliphatic alcohols and ketones. Suitable solvents of these types include methanol, ethanol and acetone, and they generally will be used in amounts no greater than 25–35%, preferably less than 1–5% of the water or aqueous detergent developer. Following development of the plate, residual surface water, and any organic solvent which also might be present, may be removed by passing a current of warm air over the relief. In some instances it may be desirable to post-expose or post-cure the plates by exposing to actinic light at the wave lengths recited above, after the uncrosslinked photopolymer composition has been washed away.

The printing reliefs made in accordance with this invention are most applicable to those wherein a distinct difference in height between printing and non-printing areas is required. These classes include those wherein the ink is carried by the raised portion of the relief, such as in dry-set printing and ordinary letter-press printing. Because of the flexibility, abrasion resistance, resilience, and alcohol resistance of the relief plates prepared using these compositions, they are particularly useful for flexographic printing in which alcohol based inks are employed.

What I claim and desire to protect by Letters Patent is:

1. The process of making a printing relief which comprises (1) admixing (a) a liquid terminal olefinically unsaturated linear polymer having a molecular weight in the range of from 1,000 to 20,000 selected from polymers having the structure

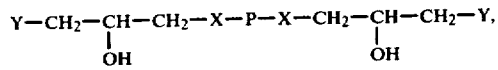

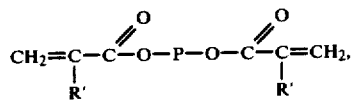

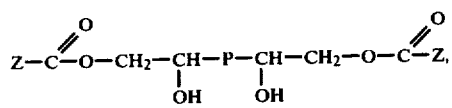

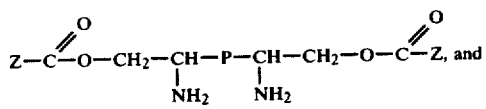

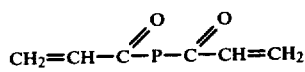

where X is selected from —O—, —S—,

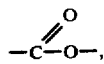

and —NH— groups; Y is selected from —O—CH$_2$—CH=CH$_2$ and

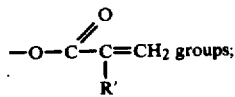

R' is selected from —H and —CH$_3$ groups; Z is selected from

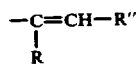

and

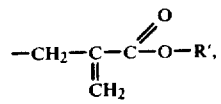

where R" is selected from —H, —CH$_3$ and

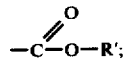

and P is a polymer residue selected from homopolymers of butadiene, isoprene, chloroprene, styrene, isobutylene, ethylene, and copolymers of butadiene with acrylonitrile, butadiene with styrene, butadiene with isoprene, ethylene with neohexene, isobutylene with styrene, isobutylene with acrylonitrile, and the corresponding saturated residues; (b) from about 1 to about 50% by weight based on the weight of the polymer of at least one ethylenically unsaturated monomer selected from acrylonitrile, methacrylonitrile, styrene, methyl substituted styrene and monomers containing one or more

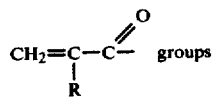 groups wherein R is hydrogen or a C$_1$–C$_3$ alkyl group; (c) from about 0.1 to about 10% by weight based on the weight of the polymer of a photoinitiator, and (d) from about 0.01 to about 2% by weight based on the weight of the polymer of a stabilizer; (2) spreading the photopolymer composition in a layer on a support to form a photopolymer element, (3) exposing to actinic light selected areas of said layer on said support until substantial cross-linking takes place in the exposed areas without significant cross-linking in the unexposed areas, and (4) removing the unexposed areas of photopolymer composition by washing the photopolymer element with an aqueous detergent solution.

2. The process of claim 1 wherein residual surface aqueous solution is removed by passing a current of warm air over the printing relief.

3. The process of claim 1 wherein the printing relief is post-exposed to actinitic light after the washing of the photopolymer element with an aqueous detergent solution.

* * * * *